United States Patent
Kobayashi et al.

(10) Patent No.: US 9,829,145 B2
(45) Date of Patent: Nov. 28, 2017

(54) MANUFACTURING METHOD OF HEAT INSULATION WALL BODY AND HEAT INSULATION WALL BODY

(71) Applicant: Tokyo Electron Limited, Tokyo (JP)

(72) Inventors: Makoto Kobayashi, Iwate (JP); Kenichi Yamaga, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 1042 days.

(21) Appl. No.: 14/050,473

(22) Filed: Oct. 10, 2013

(65) Prior Publication Data

US 2014/0113087 A1   Apr. 24, 2014

(30) Foreign Application Priority Data

Oct. 18, 2012   (JP) ................................ 2012-230903

(51) Int. Cl.
| | |
|---|---|
| B32B 1/08 | (2006.01) |
| F16L 59/02 | (2006.01) |
| H01L 21/67 | (2006.01) |
| F27D 1/04 | (2006.01) |

(52) U.S. Cl.
CPC ............. *F16L 59/024* (2013.01); *B32B 1/08* (2013.01); *F27D 1/04* (2013.01); *H01L 21/67103* (2013.01); *Y10T 428/13* (2015.01); *Y10T 428/24479* (2015.01)

(58) Field of Classification Search
None
See application file for complete search history.

(56) References Cited

U.S. PATENT DOCUMENTS

| | | | | |
|---|---|---|---|---|
| 2,386,776 A | * | 10/1945 | Barnsteiner .............. | H05B 3/66 174/146 |
| 3,662,438 A | * | 5/1972 | Koyama ............... | B28B 15/005 249/63 |
| 4,669,181 A | * | 6/1987 | Porzky .................. | F27D 1/0036 264/272.18 |

(Continued)

FOREIGN PATENT DOCUMENTS

| JP | 52-157035 U | 11/1977 |
|---|---|---|
| JP | 53-101140 A | 9/1978 |

(Continued)

*Primary Examiner* — Jeffrey Wollschlager
*Assistant Examiner* — Armand Melendez
(74) *Attorney, Agent, or Firm* — Abelman, Frayne & Schwab (57) ABSTRACT

Disclosed is a method of manufacturing a heat insulation wall body, by which the heat insulation wall body can be manufactured economically. The method is a manufacturing method of a heat insulation wall body having a groove portion formed by a first side wall, a second side wall and a groove bottom. The method includes dispersing and mixing a heat insulating material in an aqueous medium to prepare a slurried heat insulating material, bringing a molding die having a vent and a surface corresponding to a shape of the groove portion, into the obtained slurried heat insulating material, and dehydrating the slurried heat insulating material via the vent, and releasing the molding die from the heat insulating material to prepare the heat insulation wall body in which a depth of the groove portion is fixed, and a width of the groove bottom is varied in a longitudinal direction of the groove portion.

10 Claims, 9 Drawing Sheets

(56) References Cited

U.S. PATENT DOCUMENTS

2002/0043527 A1* 4/2002 Ito .................. H01L 21/67103
219/444.1

FOREIGN PATENT DOCUMENTS

| JP | 07-058046 A | 3/1995 |
| JP | 2007-088325 A | 4/2007 |
| JP | 2009-193865 A | 8/2009 |
| KR | 10-2008-0106073 A | 12/2008 |

* cited by examiner

MANUFACTURING METHOD OF HEAT INSULATION WALL BODY AND HEAT INSULATION WALL BODY

CROSS-REFERENCE TO RELATED APPLICATIONS

This application is based on and claims priority from Japanese Patent Application No. 2012-230903, filed on Oct. 18, 2012, with the Japan Patent Office, the disclosure of which is incorporated herein in its entirety by reference.

TECHNICAL FIELD

The present disclosure relates to a method for manufacturing a heat insulation wall body, and the heat insulation wall body.

BACKGROUND

For example, in manufacturing a semiconductor device, processes such as, for example, a deposition process, an oxidation process, a diffusion process, an annealing process, and an etching process are performed on a semiconductor wafer which is an object to be processed. When such processes are performed, a heating apparatus that includes a processing container configured to accommodate an object to be processed, and a heater device disposed around the processing container is generally used.

As an example of the heater device, Japanese Patent Laid-Open Publication No. 2007-88325 discloses a heater device which has a cylindrical heat insulation wall body configured to cover a processing container in its entirety, and resistance heating elements provided on the inner circumference of the heat insulation wall body, in which a plurality of groove portions configured to accommodate the resistance heating elements are formed on the heat insulation wall body. See, e.g., Japanese Patent Laid-Open Publication No. 2007-88325.

SUMMARY

The present disclosure provides a method of manufacturing a heat insulation wall body having a groove portion formed by a first side wall, a second side wall and a groove bottom. The method includes: dispersing and mixing a heat insulating material in an aqueous medium to prepare a slurried heat insulating material; bringing a molding die having a vent and a surface corresponding to a shape of the groove portion, into the obtained slurried heat insulating material, and dehydrating the slurried heat insulating material via the vent; and releasing the molding die from the heat insulating material to prepare the heat insulation wall body in which a depth of the groove portion is fixed, and a width of the groove bottom is varied in a longitudinal direction of the groove portion.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other modifications may be made without departing from the spirit or scope of the subject matter presented here.

A heat insulation wall body of a heater device disclosed in Japanese Patent Laid-Open Publication No. 2007-88325 is formed by stacking a plurality of cylindrical heat insulation blocks having groove portions in the axial direction. Accordingly, the manufacturing of the heat insulation wall body requires considerable labor and time.

An object of the present disclosure is to provide a method for manufacturing a heat insulation wall body, by which the heat insulation wall body can be manufactured economically.

An aspect of the present disclosure is to provide a method of manufacturing a heat insulation wall body having a groove portion formed by a first side wall, a second side wall and a groove bottom, the method including: dispersing and mixing a heat insulating material in an aqueous medium to prepare a slurried heat insulating material; bringing a molding die having a vent and a surface corresponding to a shape of the groove portion, into the obtained slurried heat insulating material, and dehydrating the slurried heat insulating material via the vent; and releasing the molding die from the heat insulating material to prepare the heat insulation wall body in which a depth of the groove portion is fixed, and a width of the groove bottom is varied in a longitudinal direction of the groove portion.

The heat insulation wall body is plate-shaped, and the releasing releases the molding die from the heat insulating material in the longitudinal direction of the groove portion.

The width of the groove bottom is expanded in a release direction.

An angle formed by the first side wall and the groove bottom and/or an angle formed by the second side wall and the groove bottom are varied in a release direction.

The heat insulation wall body is semi-cylindrical shaped, and the releasing releases the molding die from the heat insulating material in a direction perpendicular to a circumferential direction of the heat insulation wall body, which is a radial direction of a heat insulator.

The width of the groove bottom is increased from a central portion of the circumferential direction of the heat insulation wall body to an end surface of the heat insulation wall body.

A gap between the first side wall and the second side wall is expanded in a direction away from the groove bottom, which is a release direction.

An angle formed by the first side wall and the groove bottom and/or an angle formed by the second side wall and the groove bottom are/is varied from a central portion of a circumferential direction of the heat insulation wall body to an end surface of the heat insulation wall body.

An angle formed by the first side wall and the groove bottom and/or an angle formed by the second side wall and the groove bottom are/is greater than 90°.

A corner portion formed by the first side wall and the groove bottom and/or a corner portion formed by the second side wall and the groove bottom are/is R-chamfered or C-chamfered.

Another aspect of the present disclosure is to provide a heat insulation wall body including a groove portion, in which the groove portion is formed by a first side wall, a second side wall and a groove bottom, a depth of the groove portion is fixed, and a width of a groove bottom of the groove portion is varied in a longitudinal direction of the groove portion.

The heat insulation wall body is plate-shaped, and an angle formed by the first side wall and the groove bottom and/or an angle formed by the second side wall and the groove bottom are/is varied in the longitudinal direction of the groove portion.

The heat insulation wall body is semi-cylindrical shaped, and the width of the groove bottom is increased from a central portion of a circumferential direction of the heat insulation wall body to an end surface of the heat insulation wall body.

A gap between the first side wall and the second side wall is expanded in a direction perpendicular to the end surface, that is, a direction away from the groove bottom.

An angle formed by the first side wall and the groove bottom and/or an angle formed by the second side wall and the groove bottom are/is greater than 90°.

A corner portion formed by the first side wall and the groove bottom and/or a corner portion formed by the second side wall and the groove bottom are/is R-chamfered or C-chamfered.

A further aspect of the present disclosure is to provide a cylindrical shaped heat insulation wall body that is formed by fixing end surfaces of two semi-cylindrical heat insulation wall bodies with the same size to each other, in which each of the semi-cylindrical heat insulation wall bodies is the above described heat insulation wall body in the cylindrical shape.

Thus, it is possible to provide a method of manufacturing a heat insulation wall body, by which the heat insulation wall body can be manufactured economically.

Hereinafter, exemplary embodiments of the present disclosure will be described with reference to accompanying drawings.

(Method of Manufacturing Heat Insulation Wall Body Using Conventional Suction Molding Method)

As a method of manufacturing a heat insulator in a predetermined shape, a suction molding method has been conventionally known.

A method of manufacturing a heat insulation wall body through a suction molding method will be briefly described. First, a heat insulating material is dispersed in an aqueous medium and mixed in a slurry state. The obtained slurry comes in contact with a molding die having a vent, and moisture in the slurry is sucked (dehydrated) from the vent. Then, the molding die is released to prepare a heat insulation wall body having a shape that corresponds to a shape of the molding die.

Figure 1A:
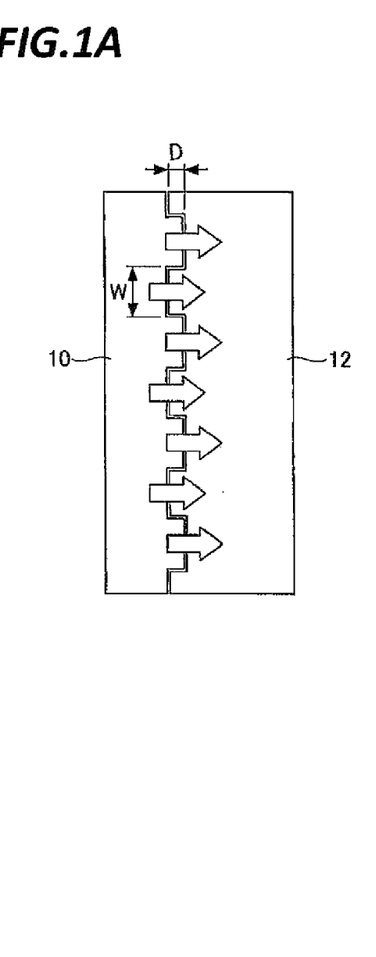
FIGS. 1A and 1B are schematic views for describing a method of manufacturing a heat insulation wall body using a conventional suction molding method.
Figure 1B:
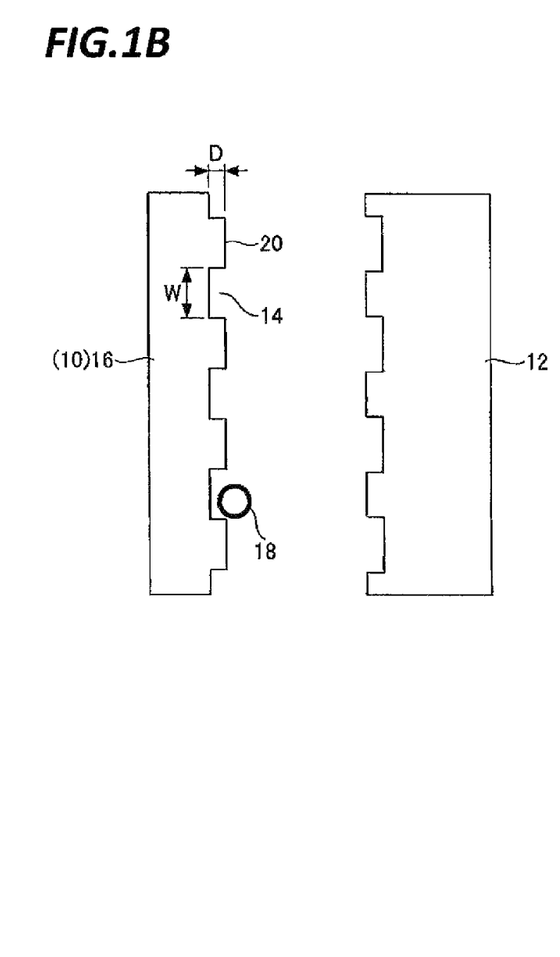

FIGS. 1A and 1B schematic views for describing a method of manufacturing a heat insulation wall body using a conventional suction molding method. FIG. 1A illustrates a schematic view illustrating the state where a heat insulator is in contact with a molding die, and FIG. 1B illustrates a schematic view of the heat insulator after the molding die is released.

As described above, the heat insulating material is first dispersed in an aqueous medium, and mixed in a slurry state. Then, as illustrated in FIG. 1A, in a state where a slurry 10 is in contact with a molding die 12, moisture in the slurry 10 is dehydrated by sucking using, for example, a vacuum pump (not illustrated) via a vent (not illustrated) formed on the surface of the molding die 12.

By the suction, a force is applied to the slurry 10, for example, in the arrow direction of FIG. 1A. Then, the shape of the surface of the slurry 10 that is in contact with the molding die 12 becomes corresponding to the shape of the molding die 12. Accordingly, when a heat insulation wall body 16 having a groove portion 14 configured to hold resistance heating elements is manufactured, the molding die 12 is designed in a required shape in advance such that the groove portion 14 with a predetermined groove width W and a predetermined groove depth D may be formed in the slurry 10.

Then, the molding die 12 is released in the suction direction to obtain the heat insulation wall body 16 having a required surface shape, as illustrated in FIG. 1B.

Through the above described suction molding method, for example, the heat insulation wall body 16 having the groove portion 14 may be obtained. In the present specification, the groove portions 14 indicates a concave portion that is configured to hold the resistance heating elements 18, and formed on the surface of the heat insulation wall body 16. Further, hereinafter, a convex portion between the adjacent groove portions 14 is referred to as an eave 20.

The resistance heating elements 18 held by the groove portion 14 of the heat insulation wall body 16 is thermally expanded or contracted by heating or cooling of a heater. Accordingly, a groove depth D of the groove portion 14 is required to be sufficiently large so as to cope with thermal expansion and thermal contraction of the resistance heating elements 18. However, when the groove portion 14 with a large groove depth D is manufactured by the above described conventional suction molding method, the heat insulation wall body 16 may be destructed by, for example, friction between the molding die 12 and the heat insulation wall body 16. That is, the conventional suction molding method has a problem in that it is impossible to form the groove portion 14 having a groove depth D enough to hold the resistance heating elements 18.

(Method of Manufacturing Heat Insulation Wall Body According to Exemplary Embodiment of the Present Disclosure)

Hereinafter, description will be made on a manufacturing method of a heat insulation wall body through a suction molding method, according to an exemplary embodiment of the present disclosure, which may solve the above described problems.

Figure 2:
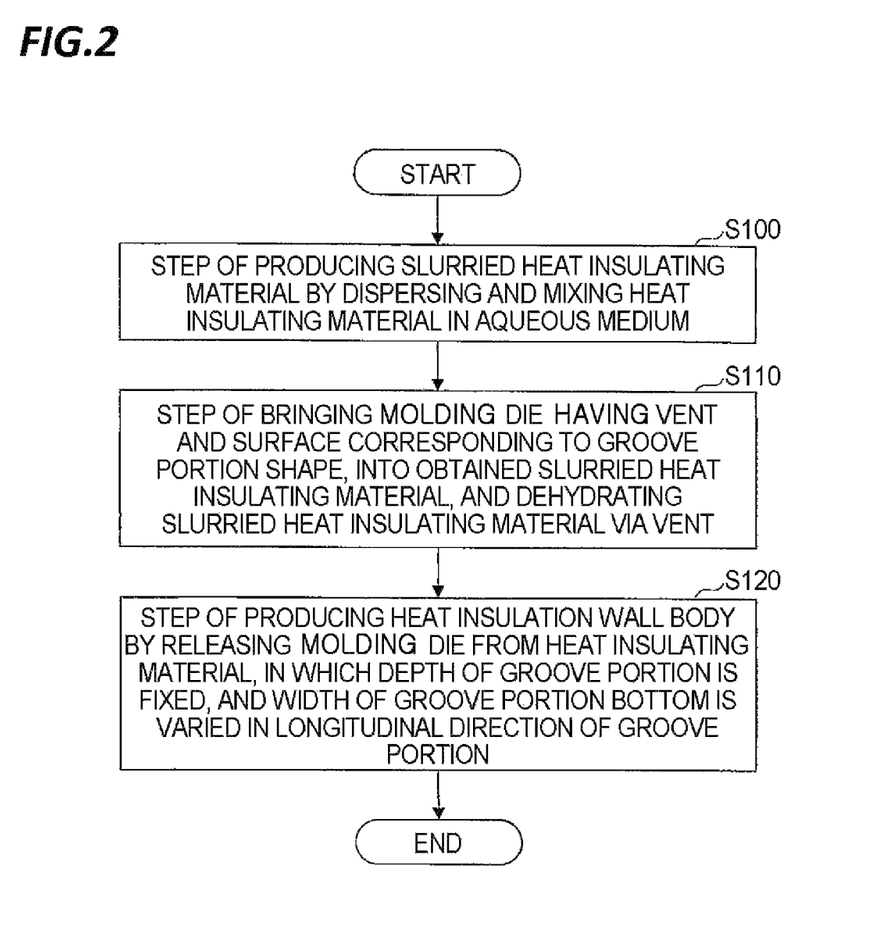
FIG. 2 is a flowchart illustrating an example of a method of manufacturing a heat insulation wall body, according to an exemplary embodiment of the present disclosure.

FIG. 2 is a flow-chart illustrating an example of a method of manufacturing a heat insulation wall body, according to an exemplary embodiment of the present disclosure.

A method of manufacturing a heat insulation wall body according to the present disclosure is a method of manufacturing a heat insulation wall body having a groove portion configured to hold resistance heating elements, which includes: a step S100 of dispersing and mixing a heat insulating material in an aqueous medium to prepare a slurried heat insulating material, a step S110 of bringing a molding die having a vent and a surface corresponding to the shape of the groove portion, into the obtained slurried heat insulating material, and dehydrating the slurried heat insulating material via the vent, and a step S120 of releasing the molding die from the heat insulating material to prepare the heat insulation wall body in which a depth of the groove portion is fixed, and a width of the groove portion is varied in the longitudinal direction of the groove portion.

In the step S100 of preparing the slurried heat insulating material, the heat insulating material is first dispersed in the aqueous medium and mixed in the slurry state. Then, in the step S110 of dehydrating the heat insulating material in a state where the obtained slurry is in contact with the molding die, moisture in the slurry is dehydrated by being sucked via a vent (not illustrated) formed on the surface of the molding die by using, for example, a vacuum pump. Then, in the step of preparing the heat insulation wall body, the molding die is released, thereby obtaining the heat insulation wall body which has a shape in which a depth of the groove portion is fixed, and a width of the groove portion is varied in the longitudinal direction of the groove portion.

Details will be described in the following exemplary embodiments, but in the manufacturing method of the heat insulation wall body according to the present disclosure, the molding die is easily released because heat insulation wall body is manufactured such that the width of the groove portion is varied in the longitudinal direction of a groove portion. Accordingly, even in a case where the heat insulation wall body having a groove portion with a large groove depth D is manufactured, a possibility that the heat insulation wall body 16 is destructed may be reduced.

Further, even though the heat insulation wall body according to the present disclosure is plate-shaped or semi-cylindrical, it may be manufactured in the same manner.

In the heat insulation wall body disclosed in Japanese Patent Laid-Open Publication No. 2007-88325, a plurality of cylindrical heat insulation blocks, each having one groove portion, are stacked one another in the axial direction to form a plurality of groove portions. Accordingly, heat insulation blocks have to be prepared and laminated in advance according to the number of the groove portions. However, in the manufacturing method of the heat insulation wall body according to the present disclosure, even the heat insulation wall body having a plurality of groove portions may be formed at once through a single release.

Hereinafter, various configuration examples of a heat insulation wall body, which may be manufactured by the manufacturing method of the heat insulation wall body according to the present disclosure, will be described in detail with reference to exemplary embodiments.

(First Exemplary Embodiment)

In the first exemplary embodiment and the second exemplary embodiment to be described later, exemplary embodiments for manufacturing a heat insulation wall body 16 formed in a plate shape which has a groove portion 14, will be described with reference to drawings.

Figure 3:
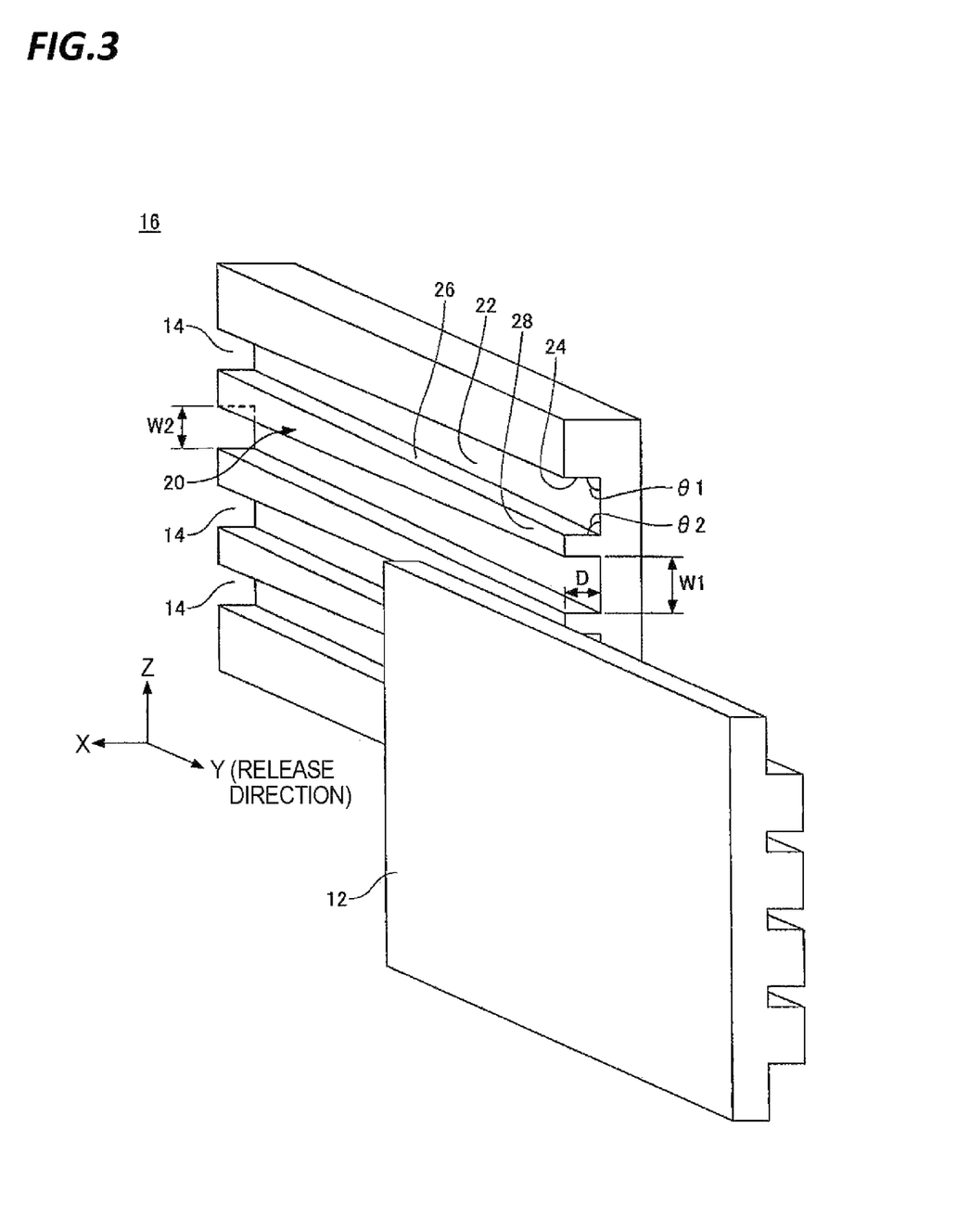
FIG. 3 is a schematic view illustrating an example of a heat insulation wall body according to a first exemplary embodiment.

FIG. 3 is a schematic view illustrating an example of a heat insulation wall body according to a first exemplary embodiment.

The heat insulation wall body 16 according to the first exemplary embodiment is formed in a plate shape, in which the groove portion 14 of the heat insulation wall body 16 has a cross-section which is, for example, rectangular when viewed from the thickness direction.

The groove portion 14 is formed by a first surface 22 that constitutes a groove bottom, a second surface 24 that constitutes one of a pair of side walls, and a third surface 26 that constitutes the other side wall. In FIG. 3, the X axis direction is a depth direction of the groove portion 14, the Y axis direction is a longitudinal direction of the groove portion 14, and the Z axis direction is a width direction of the groove portion 14. In the present exemplary embodiment, the release of the molding die 12 is carried out in the longitudinal direction of the groove portion 14.

In the heat insulation wall body 16 of the present exemplary embodiment, the depth D of the groove portion 14 is fixed, and the width of the first surface 22 (groove bottom) of the groove portion 14 is varied in the longitudinal direction (Y axis direction) of the groove portion 14. In the example of FIG. 3, the width W1 of the first surface 22 at the downstream end in the release direction is set to be larger than the width W2 of the first surface 22 at the upstream end in the release direction. As illustrated in the example of FIG. 3, in the present exemplary embodiment, the width of the groove bottom is expanded in the release direction (increased according to the movement in the release direction), which allows the release to be easily performed. Thus, it is possible to form the groove portion 14 having a sufficient groove depth D.

A convex portion between the adjacent groove portions 14 is referred to as an eave 20. That is, the eave 20 is formed by the second surface 24 and the third surface 26 which are side walls, and a fourth surface 28 that constitutes the top portion of the eave 20.

In the exemplary embodiment illustrated in FIG. 3, the heat insulation wall body 16 formed in a plate shape has four groove portions 14 in the height direction, but the present disclosure is not limited to the aspect. The heat insulation wall body 16 may have one or two or more groove portions 14.

Also, in the heat insulation wall body 16 of FIG. 3, the height of the third surface 26 is fixed, and the height of the second surface 24 is varied while the width of the groove bottom is expanded in the release direction, but the present disclosure is not limited to the aspect. For example, a configuration where the height of the second surface 24 is fixed, and the height of the third surface 26 is varied, or a configuration where both the height of the second surface 24 and the height of the third surface 26 are varied may be employed.

In the heat insulation wall body 16 of the first exemplary embodiment, the angles θ1 and θ2 formed by the first surface 22, and the second surface 24 and the third surface 26 are 90°.

(Second Exemplary Embodiment)

Figure 4:
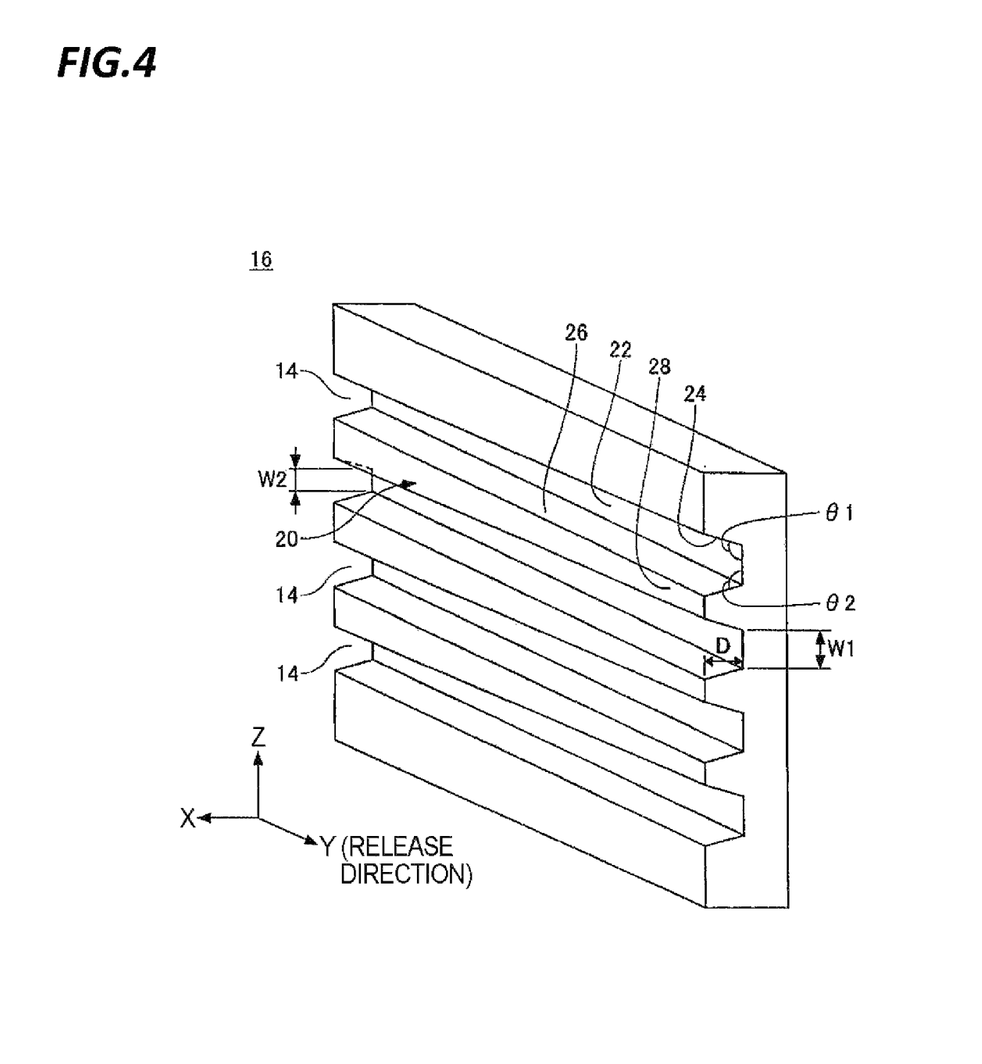
FIG. 4 is a schematic view illustrating an example of a heat insulation wall body according to a second exemplary embodiment.

FIG. 4 is a schematic view illustrating an example of a heat insulation wall body according to a second exemplary embodiment.

In the same manner as in the first exemplary embodiment, the heat insulation wall body 16 according to the second exemplary embodiment has a shape in which the width of the groove bottom of the groove portion 14 is varied in the longitudinal direction of the groove portion 14.

In the heat insulation wall body 16 according to the second exemplary embodiment, as illustrated in FIG. 4, more specifically, the angle θ1 between the first surface 22 and the second surface 24 and/or the angle θ2 between the first surface 22 and the third surface 26 are/is greater than 90°. In other words, the heat insulation wall body 16 according to the second exemplary embodiment has a shape in which the width of the groove portion 14 of the heat insulation wall body 16 is gradually increased from the groove bottom to the top portion.

Figure 5A:
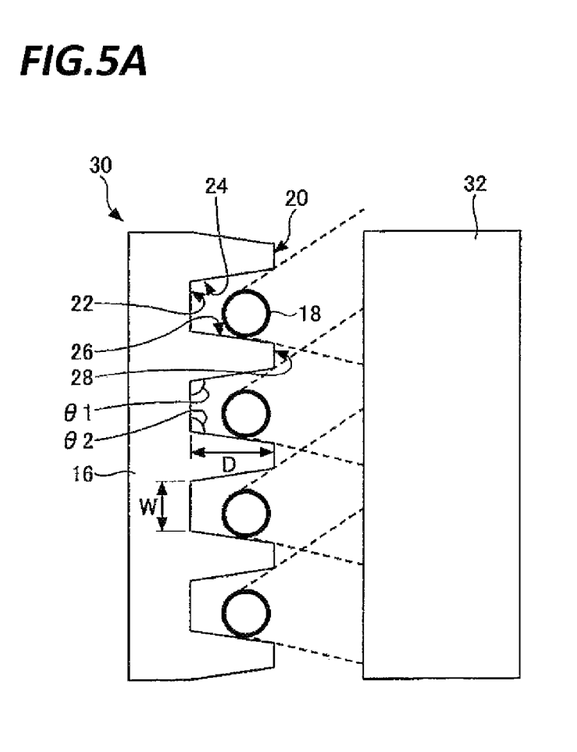
FIGS. 5A and 5B are views for describing an effect of a heater device that has the heat insulation wall body according to the second exemplary embodiment.
Figure 5B:
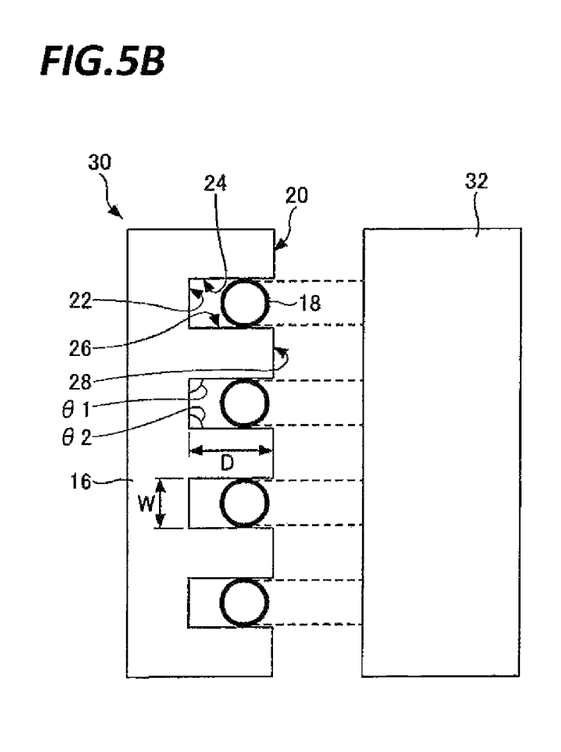

The effect achieved by the shape of the heat insulation wall body 16 according to the second exemplary embodiment in which the width of the groove portion 14 is gradually increased from the groove bottom to the top portion will be described. FIGS. 5A and 5B are views for describing an effect of a heater device that has the heat insulation wall body according to the second exemplary embodiment In FIGS. 5A and 5B, a heater device 30 has the heat insulation wall body 16 having the groove portion 14, and the resistance heating elements 18. The heat insulation wall body 16 in FIG. 5A has a configuration where the angle θ1 between the first surface 22 and second surface 24, and the angle θ2 between the first surface 22 and the third surface 26 are greater than 90°. Meanwhile, the heat insulation wall body 16 in FIG. 5B has a configuration where the angle θ1 between the first surface 22 and second surface 24, and the angle θ2 between the first surface 22 and the third surface 26 are 90°. In FIGS. 5A and 5B, the region between two dotted lines which extend from the respective resistance heating elements 18 indicates a region which may be directly heated by the respective resistance heating element 18.

In the example of FIG. 5A, since the angles between the second surface 24 and the third surface 26, and the first surface 22 are greater than 90°, the range which may be heated by radiation of the respective resistance heating elements 18 is wide. That is, a heating object 32 may be efficiently and uniformly heated. However, in the example of FIG. 5B, the angles between the second surface 24 and the third surface 26, and the first surface 22 are 90°, and the range which may be heated by radiation of the respective resistance heating elements 18 is narrow. Accordingly, there may occur a region at which the heating object 32 cannot be directly heated, and thus unevenness may occur in the heating of the heating object 32. Accordingly, it is preferred that the angle formed by at least one of the second surface 24 and the third surface 26 as side walls that constitute the groove portion 14, and the first surface 22 as the groove bottom that constitutes the groove portion 14 is greater than 90°.

The corner portion formed by any two surfaces among the first surface 22, the second surface 24, the third surface 26 and the fourth surface 28, as described later, may be R-chamfered or C-chamfered. Since the corner portion formed by the two surfaces is chamfered, the release of the molding die 12 becomes easier. Accordingly, it is possible to manufacture the heat insulation wall body 16 which has the groove portion 14 with a larger groove depth D.

FIGS. 6A to 6G are schematic views for describing a shape of a groove portion of the heat insulation wall body according the present disclosure. In the groove portion 14 in the example of FIG. 6A, both the angle θ1 between the first surface 22 and the second surface 24 and the angle θ2 between the first surface 22 and the third surface 26 are greater than 90°.

Figure 6A:
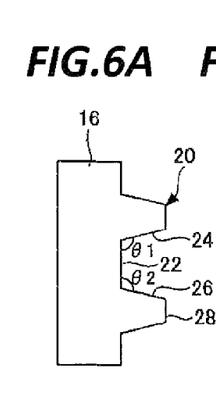
FIGS. 6A to 6G are schematic views for describing a shape of the heat insulation wall body according to the present disclosure.
Figure 6B:
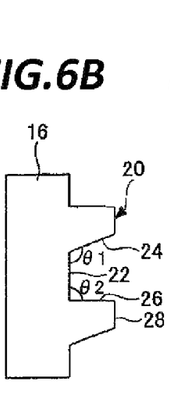
Figure 6C:
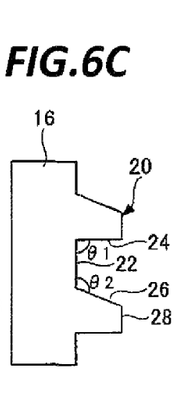

In the groove portion 14 in the examples of FIGS. 6B and 6C, any one of the angle θ1 between the first surface 22 and the second surface 24, and the angle θ2 between the first surface 22 and the third surface 26 is greater than 90°, and the other is 90°.

Figure 6D:
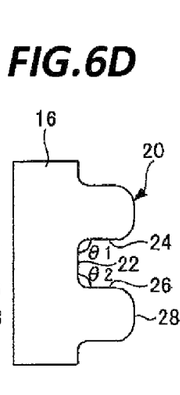

In the groove portion 14 in the example of FIG. 6D, both the angle θ1 between the first surface 22 and the second surface 24, and the angle θ2 between the first surface 22 and the third surface 26 are 90°. Further, both the corner portion formed by the first surface 22 and the second surface 24, and the corner portion formed by the first surface 22 and the third surface 26 are R-chamfered. Meanwhile, a configuration where any one of the corner portion formed by the first surface 22 and the second surface 24, and the corner portion formed by the first surface 22 and the third surface 26 is R-chamfered may be employed.

Figure 6E:
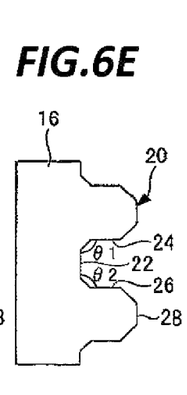

In the groove portion 14 in the example of FIG. 6E, both the angle θ1 between the first surface 22 and the second surface 24 and the angle θ2 between the first surface 22 and the third surface 26 are 90°. Further, both the corner portion formed by the first surface 22 and the second surface 24, and the corner portion formed by the first surface 22 and the third surface 26 are C-chamfered. Meanwhile, a configuration where any one of the corner portion formed by the first surface 22 and the second surface 24, and the corner portion formed by the first surface 22 and the third surface 26 is C-chamfered may be employed.

Figure 6F:
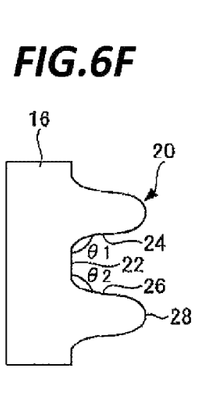

In the groove portion 14 in the example of FIG. 6F, both the angle θ1 between the first surface 22 and the second surface 24, and the angle θ2 between the first surface 22 and the third surface 26 are greater than 90°. Further, both the corner portion formed by the first surface 22 and the second surface 24, and the corner portion formed by the first surface 22 and the third surface 26 are R-chamfered. Meanwhile, a configuration where any one of the corner portion formed by the first surface 22 and the second surface 24, and the corner portion formed by the first surface 22 and the third surface 26 is R-chamfered may be employed.

Figure 6G:
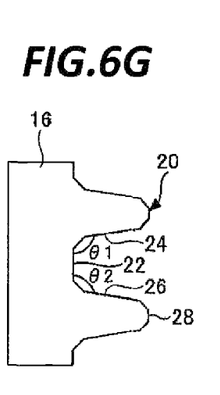

In the groove portion 14 in the example of FIG. 6G, both the angle θ1 between the first surface 22 and the second surface 24, and the angle θ2 between the first surface 22 and the third surface 26 are greater than 90°. Further, both the corner portion formed by the first surface 22 and the second surface 24, and the corner portion formed by the first surface 22 and the third surface 26 are C-chamfered. Meanwhile, a configuration where any one of the corner portion formed by the first surface 22 and the second surface 24, and the corner portion formed by the first surface 22 and the third surface 26 is C-chamfered may be employed.

Among them, the examples illustrated in FIGS. 6F and 6G are preferably employed. When the corner portion formed by the two surfaces is chamfered as in the examples illustrated in FIGS. 6F and 6G, the release of the molding die 12 becomes easier. Accordingly, it is possible to manufacture the heat insulation wall body 16 which has the groove portion 14 with a larger groove depth D. When the groove portion 14 having the respective shapes is formed, the surface shape of the molding die 12 is designed in advance.

Through the release using the molding die 12, the groove portion 14 which corresponds to the surface shape of the molding die 12 may be formed.

In the present disclosure, the angle θ1 between the first surface 22 and the second surface 24 and the angle θ2 between the first surface 22 and the third surface 26 may be varied in the longitudinal direction of the groove portion 14. In this case, it is also preferred that the angles θ1 and θ2 are varied within the range of 90° or more.

The above described plate-shaped heat insulation wall body 16 according to the first and second exemplary embodiments is manufactured by the method as illustrated in FIG. 2. The method includes the step S100 of dispersing and mixing a heat insulating material in an aqueous medium to prepare a slurried heat insulating material, the step S110 of bringing a molding die having a vent and a surface corresponding to the shape of the groove portion, into the obtained slurried heat insulating material, and dehydrating the slurried heat insulating material via the vent, and the step S120 of releasing the molding die from the heat insulating material to prepare the heat insulation wall body in which a depth of the groove portion is fixed, and a width of the groove portion is varied in the longitudinal direction of the groove portion. In the step S120 of preparing the heat insulation wall body, the molding die 12 by which the width W of the first surface 22 as the groove bottom is varied in the longitudinal direction of the groove portion 14 is used to carry out release in the longitudinal direction of the groove portion 14. Since the molding die 12 which corresponds to the shape of the groove portion 14, that is, variation of the width of the first surface 22 in the longitudinal direction of the groove portion 14, is used to carry out release in the longitudinal direction of the groove portion 14, the friction between the groove portion 14 and the heat insulation wall body 16 may be reduced at the time of release. Accordingly, the release of the molding die 12 becomes easier, and thus it is possible to form the groove portion 14 having a groove depth D enough to hold the resistance heating elements.

As described above, in the manufacturing method of the conventional heat insulation wall body disclosed in Japanese Patent Laid-Open Publication No. 2007-88325, a plurality of cylindrical heat insulation blocks, each having one groove portion, are stacked one another in the axial direction to form a heat insulation wall body. Accordingly, heat insulation blocks have to be prepared and laminated according to the number of the groove portions when the heat insulation wall body having a plurality of groove portions is manufactured. However, in the manufacturing method of the heat insulation wall body according to the first and second exemplary embodiments, there is an advantageous effect in that even the heat insulation wall body having a plurality of groove portions may be manufactured through a single release.

As described above, in the first and second exemplary embodiments, the heat insulation wall body having a rectangular shape and a groove portion may be manufactured, in which the groove portion is formed by the groove bottom and the two side walls, the depth of the groove portion is fixed, and the width of the groove bottom of the groove portion is varied in the longitudinal direction of the groove portion.

(Third Exemplary Embodiment)

The manufacturing method of the heat insulation wall body as illustrated in FIG. 2 may be effectively employed in a case where a heat insulation wall body that has, for example, a semi-cylindrical shape, and has a groove portion on the inner circumferential surface thereof is manufactured.

In the heat insulation wall body that has a semi-cylindrical shape, and has a groove portion on the inner circumferential surface thereof, the width of the groove bottom may be varied in the circumferential direction of the semi-cylindrical shape (in the longitudinal direction of the groove portion), and may take various types. Examples thereof will be described with reference to FIGS. 7A to 9C.

Figure 7A:
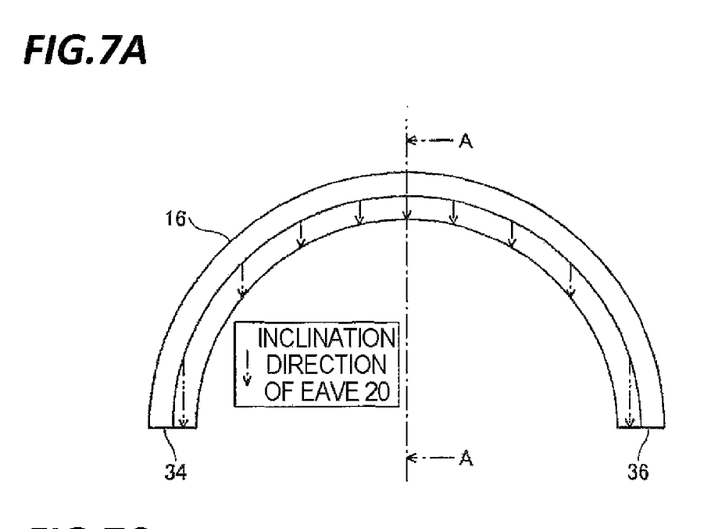
FIGS. 7A to 7C are schematic views illustrating an example of a heat insulation wall body according to a third exemplary embodiment.
Figure 7B:
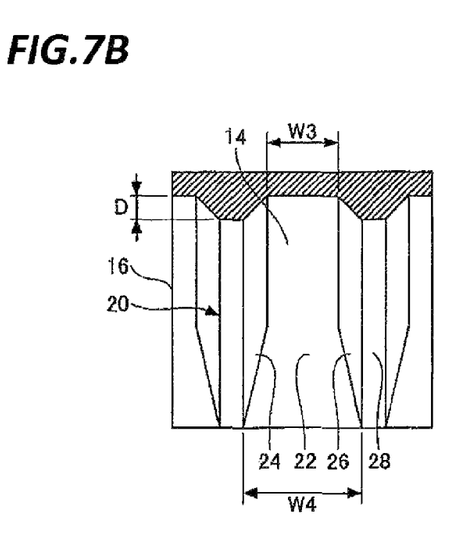
Figure 7C:
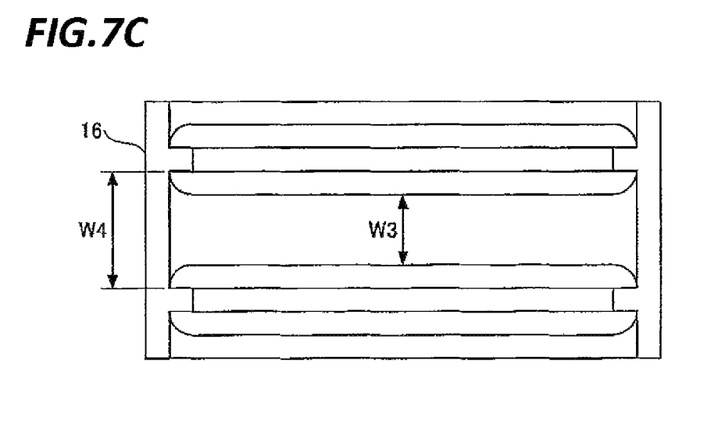

FIGS. 7A to 7C are schematic views illustrating an example of a heat insulation wall body according to a third exemplary embodiment. Specifically, FIG. 7A is a top schematic view illustrating the heat insulation wall body according to the present exemplary embodiment, FIG. 7B is a schematic view along the A-A cross-section of the heat insulation wall body of FIG. 7A, and FIG. 7C is a plan schematic view.

The heat insulation wall body 16 in FIGS. 7A to 7C is formed in a semi-cylindrical shape that has a first end surface 34 and a second end surface 36, and has the groove portion 14. In the groove portion 14 of the heat insulation wall body 16 according to the present exemplary embodiment, the groove depth D is fixed, and the width of the groove bottom [first surface 22] of the groove portion 14 is varied in the circumferential direction. When the width of the groove bottom [first surface 22] of the groove portion 14 is varied in the circumferential direction, for example, the width may be gradually increased or decreased from the central portion of the circumferential direction of the heat insulation wall body 16 to the first end surface 34 and the second end surface 36. In the example of FIGS. 7A to 7C, the width W of the first surface 22 is gradually increased, from the central portion of the circumferential direction of the heat insulation wall body 16 to the first end surface 34 and the second end surface 36. For example, as illustrated in FIGS. 7A to 7C, the width W4 of the first surface 22 at the first end surface 34 is larger than the width W3 of the first surface 22 at the central portion in the circumferential direction of the heat insulation wall body 16.

In the example of FIGS. 7A to 7C, as illustrated in the arrow of FIG. 7A, the gap between the second surface 24 and the third surface 26 is configured to be increased in the radial direction perpendicular to the circumferential direction of the semi-cylindrical heat insulation wall body 16, that is, in the release direction, while being away from the first surface 22. That is, the eave 20 is inclined in the arrow direction of FIG. 7A. Such a configuration makes it easier for the molding die 12 to be released, and thus it is possible to manufacture the heat insulation wall body 16 having the sufficient groove depth D.

The angle formed by the first surface 22 and the second surface 24 and/or the angle formed by the first surface 22 and the third surface 26 may be varied in the circumferential direction. For example, in the example of FIGS. 7A to 7C, the angle formed by the first surface 22 and the second surface 24, and the angle formed by the first surface 22 and the third surface are gradually decreased from the central portion of the circumferential direction of the heat insulation wall body 16 to the first end surface 34 and the second end surface 36. In this case, it is preferred that the angle is varied within a range of 90° or more. For example, the angle is greater than 90° at the central portion of the semi-cylindrical heat insulation wall body 16, and is 90° at the first end surface 34 and the second end surface 36.

In the example of the heat insulation wall body 16 in FIGS. 7A to 7C, the width of the fourth surface 28 is fixed.

Figure 8A:
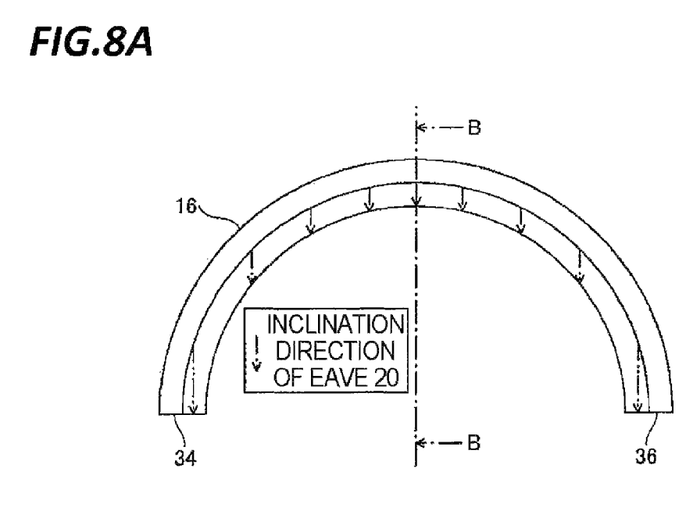
FIGS. 8A to 8C are schematic views illustrating another example of the heat insulation wall body according to the third exemplary embodiment.
Figure 8B:
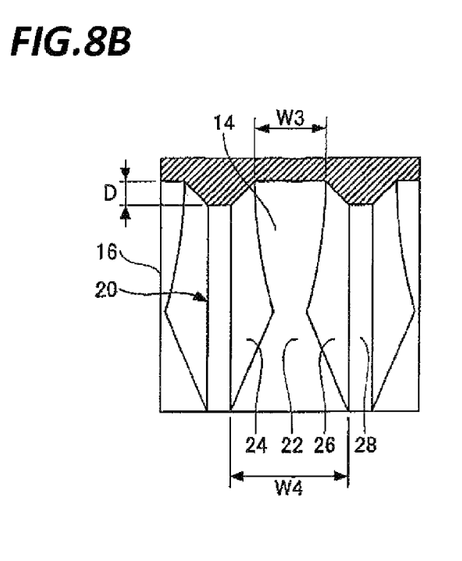
Figure 8C:
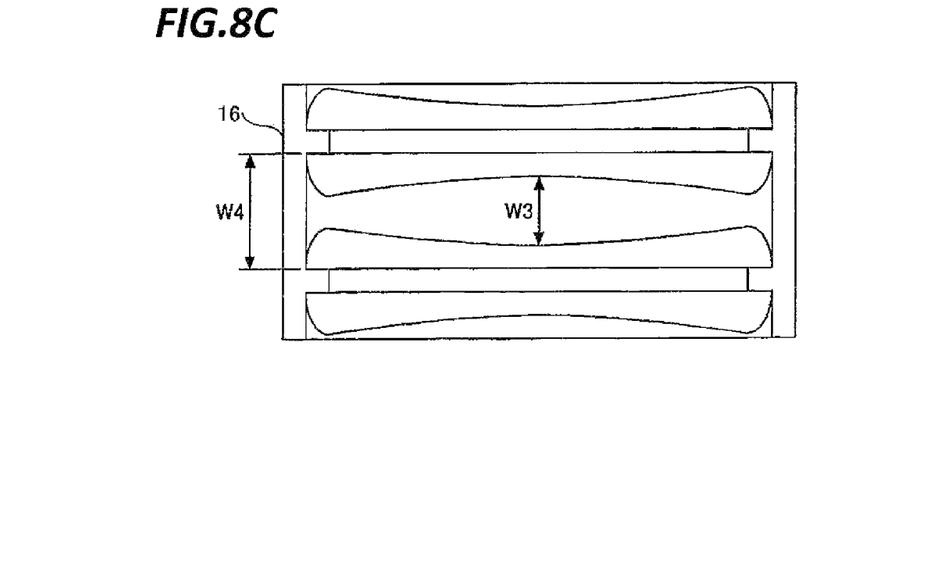

FIGS. 8A to 8C are schematic views illustrating another example of the heat insulation wall body according to the third exemplary embodiment. Specifically, FIG. 8A is a top schematic view illustrating the heat insulation wall body according to the present exemplary embodiment, FIG. 8B is a schematic view along the B-B cross-section of the heat insulation wall body of FIG. 8A, and FIG. 8C is a plan schematic view.

The heat insulation wall body 16 in FIGS. 8A to 8C is formed in a semi-cylindrical shape that has a first end surface 34 and a second end surface 36, and has the groove portion 14. In the groove portion 14 of the heat insulation wall body 16 according to the present exemplary embodiment, the groove depth D is fixed, and the width of the groove bottom [first surface 22] of the groove portion 14 is varied in the circumferential direction. The example of FIGS. 8A to 8C is configured such that the width of the first surface 22 is gradually decreased and then increased again from the central portion of the circumferential direction of the heat insulation wall body 16 to the first end surface 34 and the second end surface 36. For example, the width W4 of the first surface 22 at the first end surface 34 is larger than the width W3 of the first surface 22 at the central portion in the circumferential direction of the heat insulation wall body 16.

In the example of FIGS. 8A to 8C, as illustrated in the arrow of FIG. 8A, the gap between the second surface 24 and the third surface 26 is configured to be increased in the radial direction perpendicular to the circumferential direction of the semi-cylindrical heat insulation wall body 16, that is, in the release direction, while being away from the first surface 22. Such a configuration makes it easier for the molding die 12 to be released, and thus it is possible to manufacture the heat insulation wall body 16 having the sufficient groove depth D.

The angle formed by the first surface 22 and the second surface 24 and/or the angle formed by the first surface 22 and the third surface 26 may be varied in the circumferential direction. For example, in the example of FIGS. 8A to 8C, the angle formed by the first surface 22 and the second surface 24, and the angle formed by the first surface 22 and the third surface are greater than 90° at the central portion of the semi-cylindrical heat insulation wall body 16, are gradually increased from the central portion of the circumferential direction of the heat insulation wall body 16 to the first end surface 34 and the second end surface 36, and then decreased to 90° at the first end surface 34 and the second end surface 36. In this case, it is preferred that the angle formed by the first surface 22 and the second surface 24, and the angle formed by the first surface 22 and the third surface are varied within a range of 90° or more.

In the example of the heat insulation wall body 16 in FIGS. 8A to 8C, the width of the fourth surface 28 is fixed.

Figure 9A:
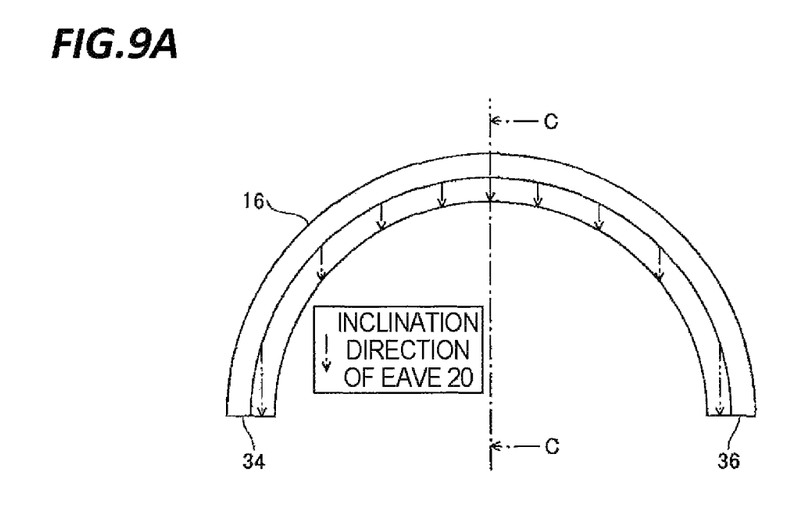
FIGS. 9A to 9C are schematic views illustrating a further example of the heat insulation wall body according to the third exemplary embodiment.
Figure 9B:
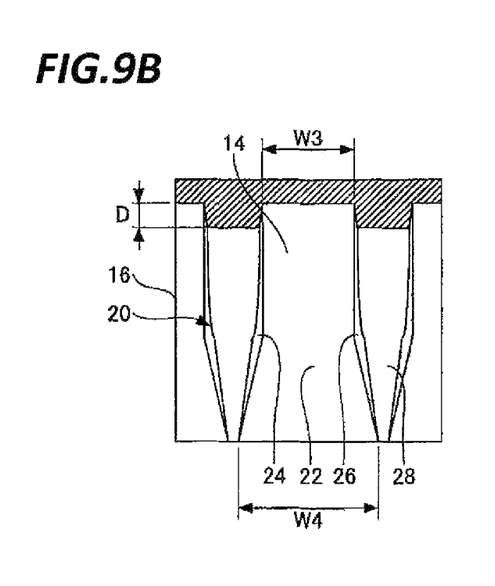
Figure 9C:
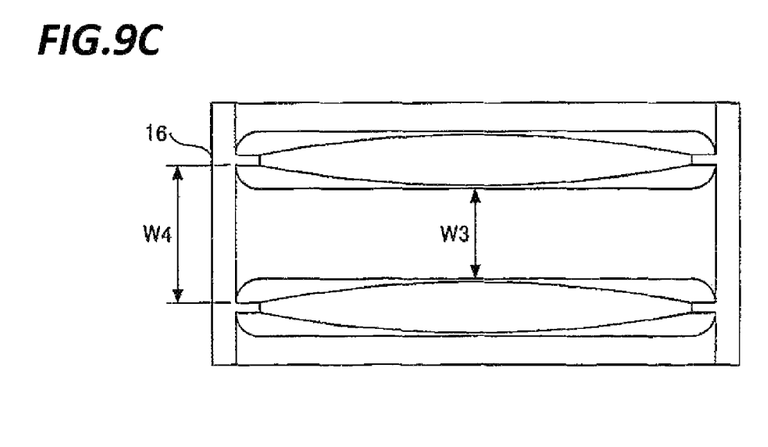

FIGS. 9A to 9C are schematic views illustrating a further example of the heat insulation wall body according to the third exemplary embodiment. Specifically, FIG. 9A is a top schematic view illustrating the heat insulation wall body according to the present exemplary embodiment, FIG. 9B is a schematic view along the C-C cross-section of the heat insulation wall body of FIG. 9A, and FIG. 9C is a plan schematic view.

The heat insulation wall body 16 in FIGS. 9A to 9C is formed in a semi-cylindrical shape that has a first end surface 34 and a second end surface 36, and has the groove portion 14. In the groove portion 14 of the heat insulation wall body 16 according to the present exemplary embodiment, the groove depth D is fixed, and the width W of the groove bottom of the groove portion 14 is varied in the circumferential direction.

In the example of FIGS. 9A to 9C, the width of the first surface 22 is gradually increased from the central portion of the circumferential direction of the heat insulation wall body 16 to the first end surface 34 and the second end surface 36. More specifically, the width W4 of the first surface 22 at the first end surface 34 is larger than the width W3 of the first surface 22 at the central portion in the circumferential direction of the heat insulation wall body 16.

In the example of FIGS. 9A to 9C, as illustrated in the arrow of FIG. 9A, the gap between the second surface 24 and the third surface 26 is configured to be increased in the radial direction perpendicular to the circumferential direction of the semi-cylindrical heat insulation wall body 16, that is, in the release direction, while being away from the first surface 22. Such a configuration makes it easier for the molding die 12 to be released, and thus it is possible to manufacture the heat insulation wall body 16 having the sufficient groove depth D. Further, in the present exemplary embodiment, the inclination angle of the eave 20 in this direction is fixed. The width of the fourth surface 28 which is a top portion of the eave 20 is configured to be decreased toward the first end surface 34 and the second end surface in the circumferential direction.

In the configuration according to the present exemplary embodiment, the angle formed by the first surface 22 and the second surface 24, and the angle formed by the first surface 22 and the third surface 26 are greater than 90° at the central portion of the semi-cylindrical heat insulation wall body 16, are gradually decreased toward the first end surface 34 and the second end surface 36 in the circumferential direction, and become 90° at the first end surface 34 and the second end surface 36.

Also, in manufacturing of the semi-cylindrical heat insulation wall body 16 according to the third exemplary embodiment, it is preferred that the corner portion formed by the first surface 22 and the second surface 24, and/or the corner portion formed by the first surface 22 and the third surface 26 are/is R-chamfered or C-chamfered. R-chamfering or C-chamfering may allow the molding die 12 to be more easily released.

In the semi-cylindrical heat insulation wall body 16 according to the present exemplary embodiment, a plurality of groove portions 14 may be formed in the axial direction. Even the heat insulation wall body 16 formed with the plurality of groove portions 14 may be manufactured through a single release by the above described manufacturing method of the heat insulation wall body 16.

When the cylindrical heat insulation wall body 16 is manufactured, first, two semi-cylindrical heat insulation wall bodies 16 with the same size are manufactured in advance by the above described manufacturing method of the heat insulation wall body according to the present exemplary embodiment. The first end surfaces 34 of the obtained two heat insulation wall bodies 16 may be fixed to each other and the second end surfaces 36 may be fixed to each other to manufacture the cylindrical heat insulation wall body 16. The end surfaces may be detachably fixed to each other or non-detachably fixed through, for example, bonding.

According to the above described third exemplary embodiment, the heat insulation wall body that has a semi-cylindrical shape and a groove portion along the circumferential direction on the inner circumferential surface thereof may be manufactured, in which the groove portion is formed by the groove bottom and the two side walls, the depth of the groove portion is fixed, and the width of the groove bottom of the groove portion is varied in the circumferential direction.

The semi-cylindrical heat insulation wall body 16 according to the third exemplary embodiment is manufactured by the method as illustrated in FIG. 2. The method includes the step S100 of dispersing and mixing a heat insulating material in an aqueous medium to prepare a slurried heat insulating material, the step S110 of bringing a molding die having a vent and a surface corresponding to the shape of the groove portion, into the obtained slurried heat insulating material, and dehydrating the slurried heat insulating material via the vent, and the step S120 of releasing the molding die from the heat insulating material to prepare the heat insulation wall body in which a depth of the groove portion is fixed, and a width of the groove portion is varied in the longitudinal direction of the groove portion. In the third exemplary embodiment, in the step S120 of preparing the heat insulation wall body, the molding die 12 by which the width of the first surface 22 as the groove bottom is varied in the longitudinal direction of the groove portion 14 is used to carry out release of the molding die 12 in the direction perpendicular to the circumferential direction of the semi-cylindrical shape. When the molding die 12 is released in this manner, it is possible to easily form the groove portion 14 having a sufficiently large groove depth D without damage to the eave 20 at the time of release.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a heat insulation wall body having a groove portion formed by a first side wall, a second side wall and a groove bottom, the method comprising:
    dispersing and mixing a heat insulating material in an aqueous medium to prepare a slurried heat insulating material;
    bringing a molding die having a vent and a surface corresponding to a shape of the groove portion, into the obtained slurried heat insulating material, and dehydrating the slurried heat insulating material via the vent; and
    releasing the molding die from the heat insulating material to prepare the heat insulation wall body in which a depth of the groove portion is uniform along a longitudinal direction of the groove portion, and a width of the groove bottom is varied in the longitudinal direction of the groove portion.

2. The method of claim 1, wherein the heat insulation wall body is plate-shaped, and the releasing releases the molding die from the heat insulating material in the longitudinal direction of the groove portion.

3. The method of claim 2, wherein the width of the groove bottom is expanded in a release direction.

4. The method of claim 2, wherein at least one of an angle formed by the first side wall and the groove bottom and an angle formed by the second side wall and the groove bottom is varied in a release direction.

5. The method of claim 1, wherein the heat insulation wall body is semi-cylindrical shaped, and the releasing releases the molding die from the heat insulating material in a direction perpendicular to a circumferential direction of the heat insulation wall body, which is a radial direction of a heat insulator.

6. The method of claim 5, wherein the width of the groove bottom is increased from a central portion of the circumferential direction of the heat insulation wall body to an end surface of the heat insulation wall body.

7. The method of claim 5, wherein a gap between the first side wall and the second side wall is expanded in a direction away from the groove bottom, which is a release direction.

8. The method of claim 5, wherein at least one of an angle formed by the first side wall and the groove bottom and an angle formed by the second side wall and the groove bottom is varied from a central portion of a circumferential direction of the heat insulation wall body to an end surface of the heat insulation wall body.

9. The method of claim 1, wherein at least one of an angle formed by the first side wall and the groove bottom and an angle formed by the second side wall and the groove bottom is greater than 90°.

10. The method of claim 1, wherein at least one of a corner portion formed by the first side wall and the groove bottom and a corner portion formed by the second side wall and the groove bottom is R-chamfered or C-chamfered.

* * * * *